(12) United States Patent
Chang et al.

(10) Patent No.: US 11,114,331 B2
(45) Date of Patent: Sep. 7, 2021

(54) METHOD FOR FABRICATING SHALLOW TRENCH ISOLATION

(71) Applicant: UNITED MICROELECTRONICS CORP., Hsin-Chu (TW)

(72) Inventors: Hao-Hsuan Chang, Kaohsiung (TW); Hung-Chun Lee, Pingtung County (TW); Shu-Ming Yeh, Tainan (TW); Ting-An Chien, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/431,684

(22) Filed: Jun. 4, 2019

(65) Prior Publication Data
US 2020/0350199 A1  Nov. 5, 2020

(30) Foreign Application Priority Data
May 3, 2019  (TW) .................................. 108115405

(51) Int. Cl.
*H01L 21/76* (2006.01)
*H01L 21/762* (2006.01)
*H01L 21/02* (2006.01)
*H01L 21/311* (2006.01)

(52) U.S. Cl.
CPC .... *H01L 21/76224* (2013.01); *H01L 21/0217* (2013.01); *H01L 21/02164* (2013.01); *H01L 21/02329* (2013.01); *H01L 21/31116* (2013.01)

(58) Field of Classification Search
CPC ......... H01L 21/02329; H01L 21/31116; H01L 21/02164; H01L 21/0217; H01L 21/76224–76237; H01L 21/823481; H01L 21/823878
USPC .......................................................... 438/437
See application file for complete search history.

(56) References Cited

U.S. PATENT DOCUMENTS

| | | | |
|---|---|---|---|
| 7,479,688 B2 | 1/2009 | Deshpande et al. | |
| 9,543,419 B1* | 1/2017 | Fan | H01L 29/66818 |
| 9,754,822 B1* | 9/2017 | Chou | H01L 29/66545 |
| 9,824,937 B1* | 11/2017 | Wang | H01L 29/785 |
| 9,881,918 B1* | 1/2018 | Huang | H01L 21/2254 |
| 2007/0054423 A1* | 3/2007 | Kanda | H01L 21/31662 |
| | | | 438/14 |
| 2008/0032482 A1* | 2/2008 | Tsai | H01L 21/76224 |
| | | | 438/424 |
| 2010/0003782 A1* | 1/2010 | Sinha | H01L 27/2472 |
| | | | 438/104 |
| 2014/0225219 A1* | 8/2014 | Huang | H01L 29/0649 |
| | | | 257/510 |

(Continued)

FOREIGN PATENT DOCUMENTS

CN  104637881  5/2015

*Primary Examiner* — Mohammad M Hoque
(74) *Attorney, Agent, or Firm* — Winston Hsu

(57) ABSTRACT

A method for fabricating semiconductor device includes the steps of: forming a trench in a substrate; forming a pad layer adjacent to two sides of trench; forming a dielectric layer to fill the trench; and performing a dry etching process to remove the pad layer and part of the dielectric layer to form a shallow trench isolation (STI). Preferably, the dry etching process comprises a non-plasma etching process.

7 Claims, 3 Drawing Sheets

(56) References Cited

U.S. PATENT DOCUMENTS

| | | | |
|---|---|---|---|
| 2014/0231919 A1* | 8/2014 | Peng | H01L 29/0649 |
| | | | 257/368 |
| 2014/0353795 A1* | 12/2014 | Tong | H01L 21/31155 |
| | | | 257/506 |
| 2015/0243659 A1* | 8/2015 | Huang | H01L 21/76224 |
| | | | 257/401 |
| 2016/0247690 A1* | 8/2016 | Takahashi | H01L 21/31116 |
| 2018/0315664 A1* | 11/2018 | Cheng | H01L 21/823878 |
| 2019/0165116 A1* | 5/2019 | Lim | H01L 29/4966 |
| 2019/0287971 A1* | 9/2019 | Lee | H01L 21/823821 |
| 2019/0355570 A1* | 11/2019 | Hsieh | H01L 21/823431 |
| 2020/0044048 A1* | 2/2020 | Yu | H01L 21/02664 |
| 2020/0105583 A1* | 4/2020 | Wang | H01L 21/76229 |
| 2020/0105875 A1* | 4/2020 | Li | H01L 29/6656 |
| 2020/0105936 A1* | 4/2020 | More | H01L 29/42392 |
| 2020/0135574 A1* | 4/2020 | Yang | H01L 21/76224 |

* cited by examiner

METHOD FOR FABRICATING SHALLOW TRENCH ISOLATION

BACKGROUND OF THE INVENTION

1. Field of the Invention

The invention relates to a method for fabricating semiconductor device, and more particularly to a method for fabricating shallow trench isolation (STI).

2. Description of the Prior Art

As semiconductor technology enters into deep submicron era, most of the devices under 0.18 micron such as complimentary metal-oxide semiconductor (CMOS) devices are fabricated with employment of shallow trench isolation (STIs) for separating adjacent devices. As semiconductor devices gradually decrease in size, the STIs used for isolating devices also reduce in size while the trenches used for fabricating STIs increase size accordingly. Even though the STIs have been widely used in current productions, how to improve the current process for fabricating STIs to obtain better performance current leakage, improved short channel effects, as well as lowering number of divots on surface of the STIs have been an important task in this field.

SUMMARY OF THE INVENTION

According to an embodiment of the present invention, a method for fabricating semiconductor device includes the steps of: forming a trench in a substrate; forming a pad layer adjacent to two sides of trench; forming a dielectric layer to fill the trench; and performing a dry etching process to remove the pad layer and part of the dielectric layer to form a shallow trench isolation (STI). Preferably, the dry etching process comprises a non-plasma etching process.

According to an embodiment of the present invention, the method further includes forming the pad layer on the substrate and removing part of the pad layer and the substrate to form the trench.

According to an embodiment of the present invention, the pad layer includes a first pad layer on the substrate and a second pad layer on the first pad layer.

According to an embodiment of the present invention, the first pad layer includes silicon oxide and the second pad layer includes silicon nitride.

According to an embodiment of the present invention, further includes forming a liner in the trench after forming the pad layer, performing a nitridation process to divide the liner into a first portion and a second portion, and forming the dielectric layer on the second portion.

According to an embodiment of the present invention, the second portion includes nitrogen ions.

According to an embodiment of the present invention, further includes performing an in-situ steam generation (ISSG) process to form the liner.

According to an embodiment of the present invention, the dry etching process includes hydrogen fluoride (HF) and ammonia gas ($NH_3$).

According to an embodiment of the present invention, the dielectric layer includes silicon oxide.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
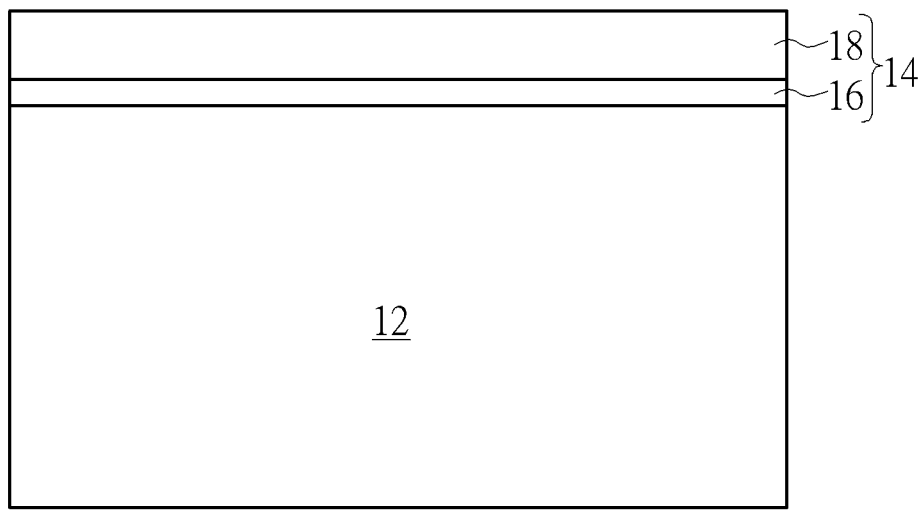
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12, such as a silicon substrate or silicon-on-insulator (SOI) substrate is provided, and a transistor region such as a PMOS region or a NMOS region is defined on the substrate. Next, a pad layer 14 is formed on the surface of the substrate 12, in which the pad layer 14 preferably includes a composite structure which could further include a pad layer 16 disposed on the surface of the substrate 12 and another pad layer 18 disposed on the pad layer 16. In this embodiment, the pad layers 16, 18 are preferably made of different insulating materials, in which the pad layer 16 preferably includes silicon oxide and the pad layer 18 preferably includes silicon nitride.

Figure 2:
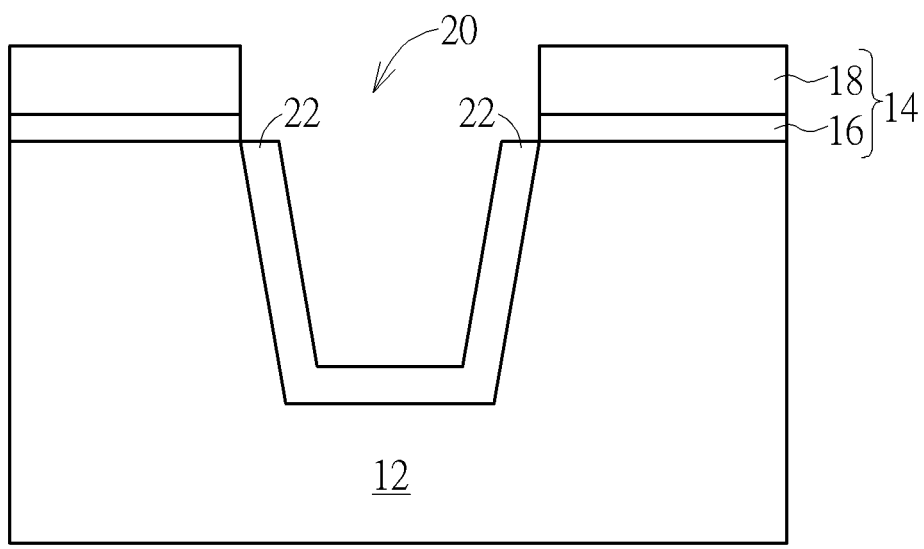

Next, as shown in FIG. 2, a pattern transfer process is conducted by first forming a patterned mask (not shown) such as a patterned resist on the surface of the pad layer 18, and then conducting an etching process by using the patterned mask as mask to remove part of the pad layer 18, part of the pad layer 16, and part of the substrate 12 to form a trench 20 in the substrate 12. Next, an in-situ steam generation (ISSG) process is conducted to form a liner 22 on all of the sidewalls exposed in the trench 20. In this embodiment, the liner 22 is preferably made of an insulating layer including but not limited to for example a silicon oxide layer containing no dopants.

Figure 3:
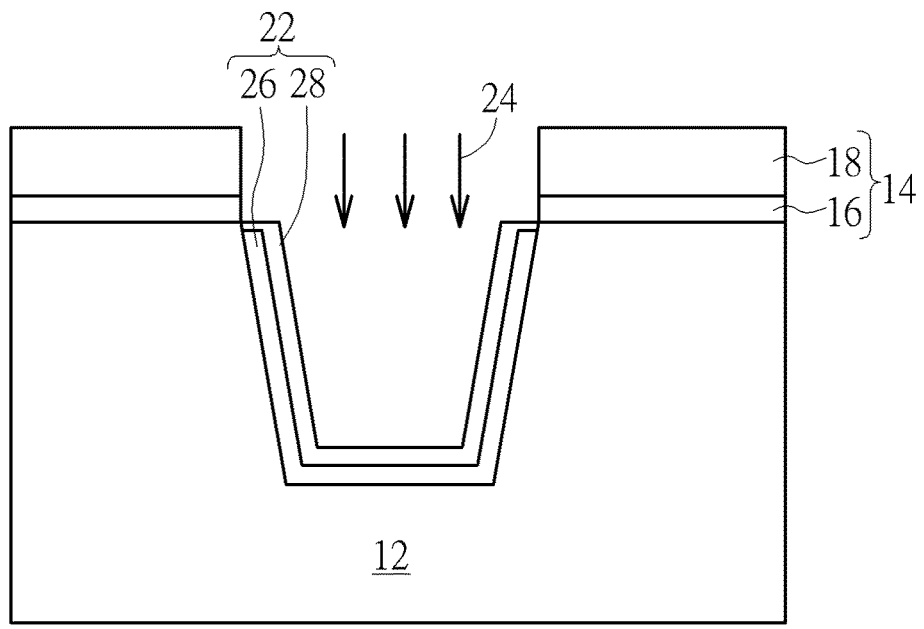

Next, as shown in FIG. 3, a nitridation process 24 is conducted to divide the liner 22 into a first portion 26 and a second portion 28. Specifically, a decoupled plasma nitridation (DPN) process is conducted at this stage by using the patterned pad layer 14 as mask to implant nitrogen ions into part of the liner 22 while separating part of the liner 22 closer to the substrate 12 into a first portion 26 and part of the liner 22 away from the substrate 12 into a second portion 28. Preferably, the first portion 26 on the lower part of the liner 22 is not implanted with any dopants during the DPN process whereas the second portion 28 on the upper part of the liner 22 is implanted with nitrogen ions during the DPN process. In this embodiment, the single-layered liner 22 is preferably divided into a dual-layered structure during the DPN process, in which the thickness of each of the divided portions could be adjusted depending on the energy of the DPN process. For instance, the thickness of the first portion 26 could be equal to, less than, or greater than the thickness of the second portion 28, which are all within the scope of the present invention.

Figure 4:
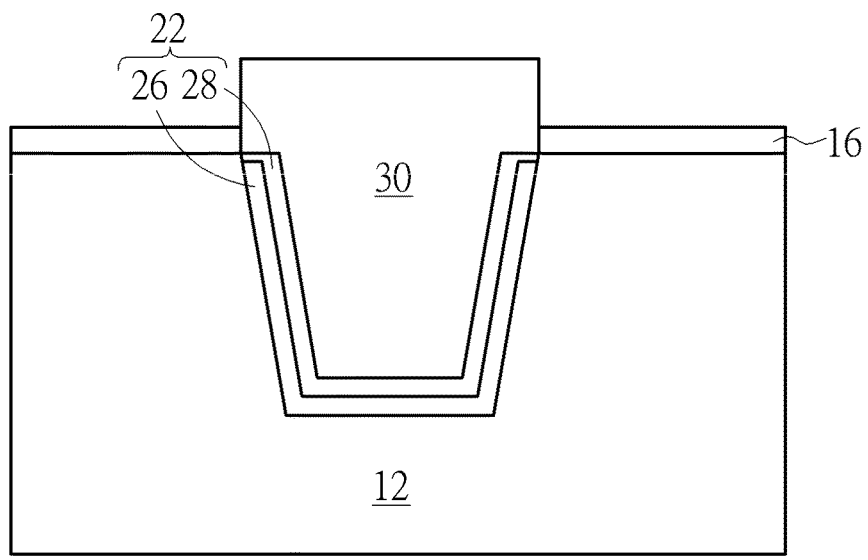

Next, as shown in FIG. 4, a dielectric layer 30 is formed to fill the trench 20, and a planarizing process such as a chemical mechanical polishing (CMP) process could be conducted selectively to remove part of the dielectric layer 30 so that the top surface of the remaining dielectric layer 30 is even with the top surface of the pad layer 18. Next, another etching process is conducted to remove the pad layer 18 adjacent to two sides of the dielectric layer 30 and expose the pad layer 16 underneath.

Figure 5:
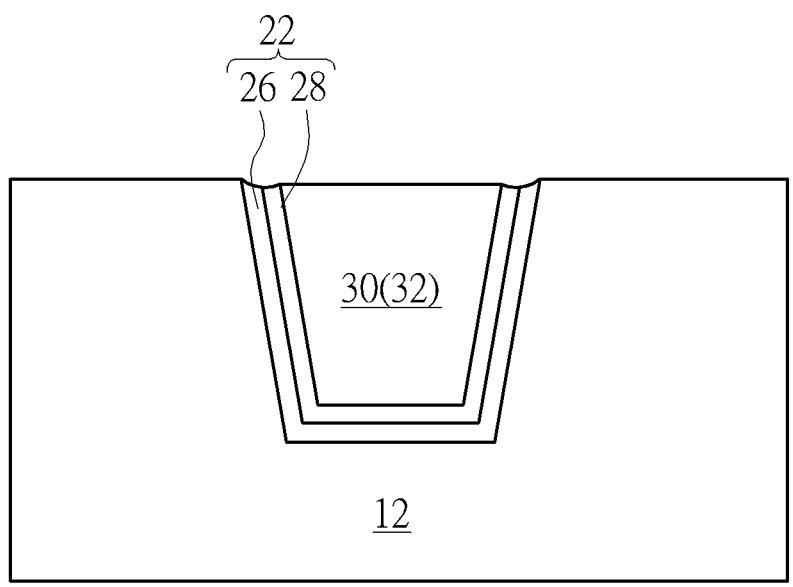

Next, as shown in FIG. 5, a dry etching process is conducted to remove part of the dielectric layer 30 and all of the pad layer 16 adjacent to two sides of the dielectric layer 30 to form a shallow trench isolation (STI). Specifically, the dry etching process conducted at this stage preferably includes a non-plasma dry etching process, in which the non-plasma dry etching process is accomplished by using hydrofluoric acid (HF) and/or ammonia gas ($NH_3$) as main etching gas to remove part of the dielectric layer as well as all of the pad layer 16 adjacent to two sides of the dielectric layer 30 to form the STI 32. Next, a thermal treatment or anneal process could be conducted after removing part of the dielectric layer 30 and all of the pad layer 16 to remove or vaporize the residues remained on the surface of the substrate 12 formed during the dry etching process.

It should be noted that in addition to dry etching process, a wet etching process is typically employed during the formation of the STI 32 to remove the pad layer 16 adjacent to two sides of the dielectric layer 30. The wet etching process however often causes divots on the top surface of the STI 32 as well as the adjacent liner 22 and affects the performance of the device. To resolve this issue, the present invention preferably conducts a dry etching process and without any wet etching process before forming gate dielectric layer of a MOS transistor to remove part of the dielectric layer 30 and pad layer 16 to form a STI 32. By following this approach, no divots would be formed on the top surface of the STI 32 and adjacent liner 22 and smoothness of the STI 32 could also be improved substantially. In this embodiment, the temperature of the dry etching process is preferably between 10° C. to 80° C. and the temperature of the thermal treatment or anneal process is preferably between 100° C. to 250° C. After the STI 32 is formed, follow-up fabrication process could be conducted by forming semiconductor device such as MOS transistors or memory devices adjacent to the STI 32 while using the STI 32 to isolate the adjacent devices. Since the fabrication of MOS transistors and memory devices are well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:

forming a pad layer on a substrate, wherein the pad layer comprises:

a first pad layer on the substrate; and a second pad layer on the first pad layer;

removing part of the pad layer and the substrate to form a trench;

forming a liner in the trench after removing part of the pad layer;

performing a nitridation process to divide the liner into a first portion and a second portion, wherein the second portion comprises a lateral extending portion covering an end portion of the first portion and flush with a top surface of the substrate;

after the nitridation process, forming a dielectric layer to fill the trench;

performing a planarizing process to remove the dielectric layer so that the top surfaces of the dielectric layer and the pad layer are coplanar;

removing the second pad layer;

after removing the second pad layer, performing a dry etching process to remove the first pad layer, part of the liner, and part of the dielectric layer at the same time to form a shallow trench isolation (STI), wherein the dry etching process comprises a non-plasma etching process, and after the dry etching process, a top surface of the liner comprises a curve, and a top surface of the dielectric layer comprises a planar surface that is flush with the top surface of the substrate; and performing an anneal process to remove residues on a top surface of the substrate after removing the first pad layer and part of the dielectric layer.

2. The method of claim 1, wherein the first pad layer comprises silicon oxide and the second pad layer comprises silicon nitride.

3. The method of claim 1, wherein the dielectric layer directly contacts the second portion of the liner and a sidewall of the first pad layer.

4. The method of claim 1, wherein the second portion comprises nitrogen ions.

5. The method of claim 1, further comprising performing an in-situ steam generation (ISSG) process to form the liner.

6. The method of claim 1, wherein the dry etching process comprises hydrogen fluoride (HF) and ammonia gas ($NH_3$).

7. The method of claim 1, wherein the dielectric layer comprises silicon oxide.

* * * * *